FIP8212 UK 3,821,545

250/201

United States Patent [19]

Nakagawa et al.

[11] 3,821,545

[45] June 28, 1974

[54] MASK ALIGNMENT IN MANUFACTURING SEMICONDUCTOR INTEGRATED CIRCUITS

[75] Inventors: Yasuo Nakagawa; Nobuyuki Akiyama, both of Yokohama, Japan

[73] Assignee: Hitachi, Ltd., Tokyo, Japan

[22] Filed: May 22, 1973

[21] Appl. No.: 362,733

[30] Foreign Application Priority Data

May 26, 1972 Japan .................................. 47-51662

June 2, 1972 Japan .................................. 47-54338

[52] U.S. Cl. .................................. 250/201, 250/204

[51] Int. Cl. .................................. G01j 1/20, G01j 1/36

[58] Field of Search .................................. 250/201, 204

[56] References Cited

UNITED STATES PATENTS 3,617,751 11/1971 Levy .................................. 250/201

3,671,748 6/1972 Friedman .................................. 250/201

*Primary Examiner*—James W. Lawrence

*Assistant Examiner*—T. N. Grigsby

*Attorney, Agent, or Firm*—Craig and Antonelli

[57] ABSTRACT

A mask for manufacture of semiconductor integrated circuits provided with a position detecting pattern for alignment of the mask with a semiconductor wafer also provided with a counterpart position detecting pattern and an arrangement for the alignment capable of both coarse alignment and fine alignment. The position detecting pattern of the mask consists of a plurality of windows arranged outwardly from the center of the pattern. The coarse alignment is performed by detecting the light reflected by the detecting pattern of the semiconductor wafer through the outermost windows of the detecting pattern of the mask, while the fine alignment is performed by detecting the reflected light through all of the windows of the pattern of the mask.

17 Claims, 6 Drawing Figures

MASK ALIGNMENT IN MANUFACTURING SEMICONDUCTOR INTEGRATED CIRCUITS

The present invention relates to the manufacture of semiconductor integrated circuits, and more particularly to a mask for manufacturing semiconductor integrated circuits which has a pattern for alignment with semiconductor wafers for the integrated circuits and an apparatus for aligning the mask with the semiconductor wafers.

Generally, a semiconductor integrated circuit is manufactured by successively transferring patterns of a series of masks on the surface of a semiconductor wafer. A high density and good performance semiconductor integrated circuit can be manufactured only by precisely aligning the successive patterns of the semiconductor wafer. The alignment of the successive patterns is effected by precisely aligning position detecting patterns provided to the semiconductor wafer and the masks at a peripheral portion thereof independently of the function of the integrated circuit. The position detecting pattern provided on the semiconductor wafer is composed of an etched portion forming an irregular surface and a non-etched portion forming a smooth surface. The former portion, i.e. the irregular surface reflects incident light irregularly, while the latter portion, i.e. the smooth surface reflects incident light regularly. Consequently, there is a considerable difference in the amount of the reflected light therebetween. This difference in the amount of reflected light can be easily detected by means of photoelectric elements disposed such that they receive the light reflected from the two portions of the pattern on the semiconductor wafer. The miss-alignment between the semiconductor wafer and the mask can be detected or controlled easily by detecting the difference in the amount of light reflected by the two portions of the position detecting pattern provided on the semiconductor wafer through the position detecting pattern of the mask overlaid thereon.

An example of the position detecting patterns of the semiconductor wafer and the mask is disclosed in Japanese Laid Open Patent Publication No. 4644/72. The position detecting pattern provided at a peripheral portion of the upper face of a semiconductor wafer is a square comprising an etched portion consisting of a meshy irregular surface and a non-etched portion consisting of a smooth surface. The position detecting pattern provided to the mask consists of a pair of transparent rectangular windows in each of the X- and Y-directions.

When light is directed from above to the position detecting pattern of the mask overlying the position detecting pattern of the semiconductor wafer, the light is reflected either by both etched portion and non-etched portion of the position detecting pattern of the wafer or by only the non-etched portion thereof through each of the windows. The relative position between the semiconductor wafer and the mask can be determined by the ratio between the amounts of the reflected light in the above two cases. Consequently, the alignment between the semiconductor wafer and the mask in the X-direction, for example, is effected by comparing the amounts of light reflected through the pair of windows detected by respective separate photoelectric elements and by bringing the amounts of the reflected light into agreement. The accuracy of the alignment is determined by the pattern gain defined herein as "the ratio $\Delta Q/Q$ of the variation $\Delta Q$ in the amount of the reflected light relative to the unit relative discrepancy in the position to the maximum detected amount of reflected light Q" and the signal-to-noise ratio of the output of the photoelectric element. Consequently, the improvement in the accuracy of alignment is effected by reducing the size of the window in the coordinate axis direction which leads to the improvement in the pattern gain.

However, this method has the disadvantage that the maximum amount of light Q detected through the window is reduced to degrade the signal-to-noise ratio of the output of the photoelectric element which is the function of the light intensity, disabling the improvement in the accuracy of alignment. In order to overcome the reduction of the above-ratio of the photoelectric element it may be conceivable that the size of the window of the position detecting pattern of the mask in the direction lateral to the coordinate axis is increased by the amount sufficient to compensate for the reduction of the size in the direction of the coordinate axis. However, this measure has the disadvantage that the size of the counterpart position detecting pattern of the semiconductor wafer is unnecessarily increased, resulting in the reduction of the number of the semiconductor integrated circuits fabricated simultaneously in the semiconductor wafer. Thus, since the accuracy of the alignment relates to both the sensitivity characteristic of the photoelectric element and the size of the position detecting pattern, the adjustment therebetween is difficult. Consequently, there is a certain limit of the accuracy in the alignment to the mask provided with the above-described conventional position detecting pattern, so that a required accuracy of alignment cannot be provided. There are other disadvantages that since the position detecting pattern consists of only one pair of pattern elements, the accuracy in the alignment is directly affected by the defect in the configuration of the pattern and the unevenness of etching.

Accordingly, an object of the present invention is to provide a mask for manufacture of semiconductor integrated circuits which has a position detecting pattern for providing improved alignment with a semiconductor wafer without increasing the size of the position detecting pattern.

Another object of the present invention is to provide an arrangement for enabling both coarse alignment and fine alignment when the position detecting pattern according to the present invention is employed.

According to one aspect of the present invention there is provided a mask for manufacture of semiconductor integrated circuits comprising a position detecting pattern consisting of a plurality of transparent windows arranged outwardly from the center of the pattern for alignment with a semiconductor wafer.

According to another aspect of the present invention there is provided an arrangement for aligning a mask for manufacture of semiconductor integrated circuits provided with a position detecting pattern consisting of a plurality of transparent windows arranged outwardly from the center of the pattern with a semiconductor wafer provided with a counterpart position detecting pattern consisting of a plurality of etched areas at the corresponding positions to the windows of the position detecting pattern of the mask, comprising means for laying the mask over the semiconductor wafer, means for illuminating the position detecting pattern of the semiconductor wafer with light through the windows of the position detecting pattern of the mask, means for effecting coarse alignment between the mask and the semiconductor wafer by detecting the amount of light reflected through the outermost windows of the position detecting pattern of the mask, and means for effecting fine alignment by detecting the amount of light reflected through all of the windows of the position detecting pattern of the mask.

A preferred embodiment of the present invention will next be described in detail by way of example for a better understanding of the present invention with reference to the accompanying drawings, in which.

Figure 1:
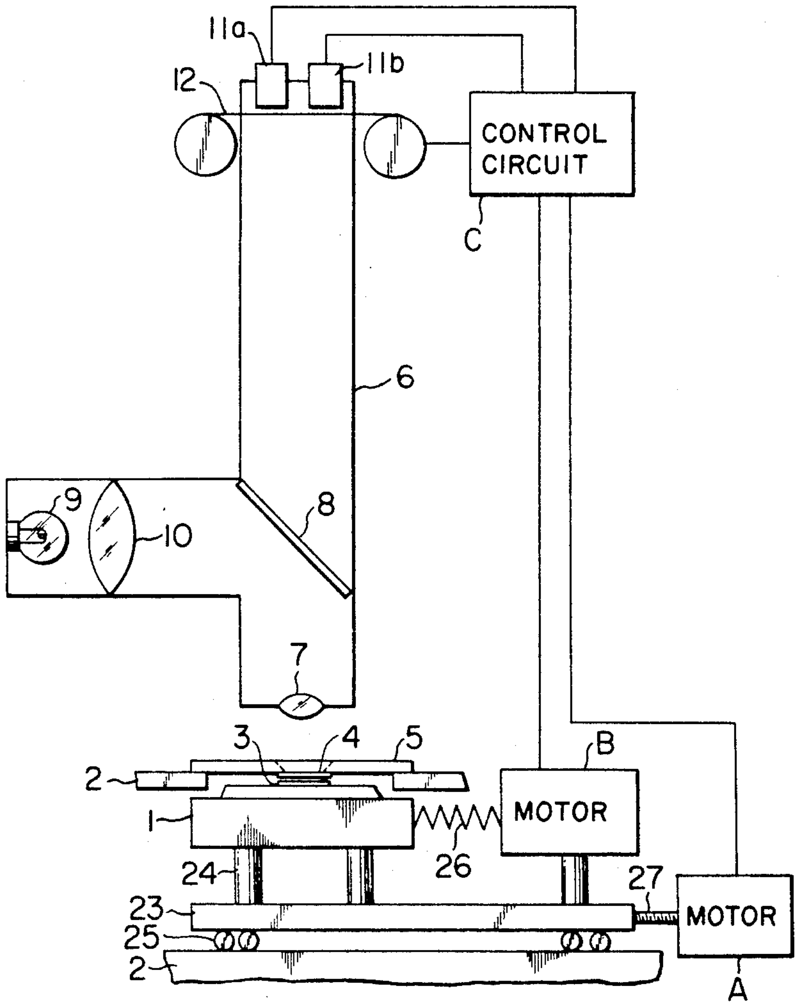
FIG. 1 is a diagram of an arrangement for photoelectric detection type alignment.

In the arrangement for photoelectric type alignment of a mask 4 with a semiconductor wafer 3 shown in FIG. 1 a wafer chuck 1 is coupled with a wafer carriage 23 movable and rotatable by means of bearings 25 on a foundation plate 2 through four elastic metallic rods 24. The wafer chuck 1 is also connected with a motor B for fine alignment fixed to the wafer carriage 23 through a coil spring 26 and is finely movable and finely rotatable by the elastic deformation of the metallic rods 24 based on the control signal from a control circuit C. The wafer carriage 23 is connected through a screw 27 with a motor A for coarse alignment fixed to the foundation plate 2 and is coarsely movable and coarsely rotatable by means of the bearings 25 based on the control signal from the control circuit C.

The semiconductor wafer 3 is held on the upper surface of the wafer chuck 1 by vacuum suction. The mask 4 is held by vacuum suction on the lower surface of a mask support 5 fixed to the foundation plate 2 and disposed over the semiconductor wafer 3 in opposing relationship.

A microscope 6 for position detection is composed of an objective lens 7 disposed at the lower end, a semitransparent mirror or beam splitter 8 disposed at an intermediate position, a light source 9 and a condenser lens 10 disposed at a side, and a set of four photoelectric elements 11 and a switching slit 12 disposed at the upper end.

Light emitted by the light source 9 passes through the condenser lens 10 and, after reflected by the semitransparent mirror 8, is directed through the objective lens 7 to the mask 4 and the semiconductor wafer 3. The light is then reflected by the semiconductor wafer 3 to the photoelectric elements 11 through the windows of the mask 4, the objective lens 7, the semitransparent mirror 8 and the switching slit 12. The four photoelectric elements 11 correspond to respective regions of the mask 4 which will be described hereinbelow and receive images of the respective regions. Thus, each of the photoelectric elements 11 receives the reflected light passing through the corresponding region of the mask 4 independently of the other regions to produce an electric signal proportional to the amount of the received reflected light which is supplied to the control circuit C. The control circuit C differentially amplifies the signals received from the photoelectric elements 11. The control circuit C also identifies the signal received from the switching slit 12 to decide whether the state is a coarse alignment state or a fine alignment state so that it can supply a signal to the motor A for coarse alignment or to the motor B for fine alignment.

Figure 2:
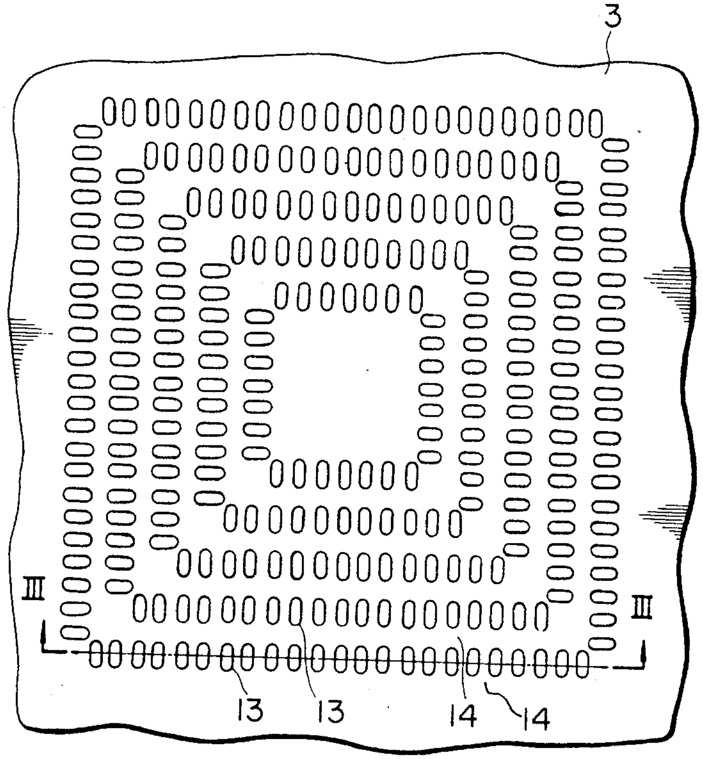
FIG. 2 is a plan view of a position detecting pattern formed on a semiconductor wafer by etching.
Figure 3:
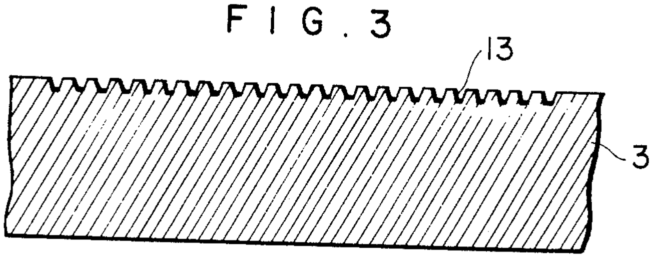
FIG. 3 is a cross-section taken along the line III—III in FIG. 2.
Figure 4:
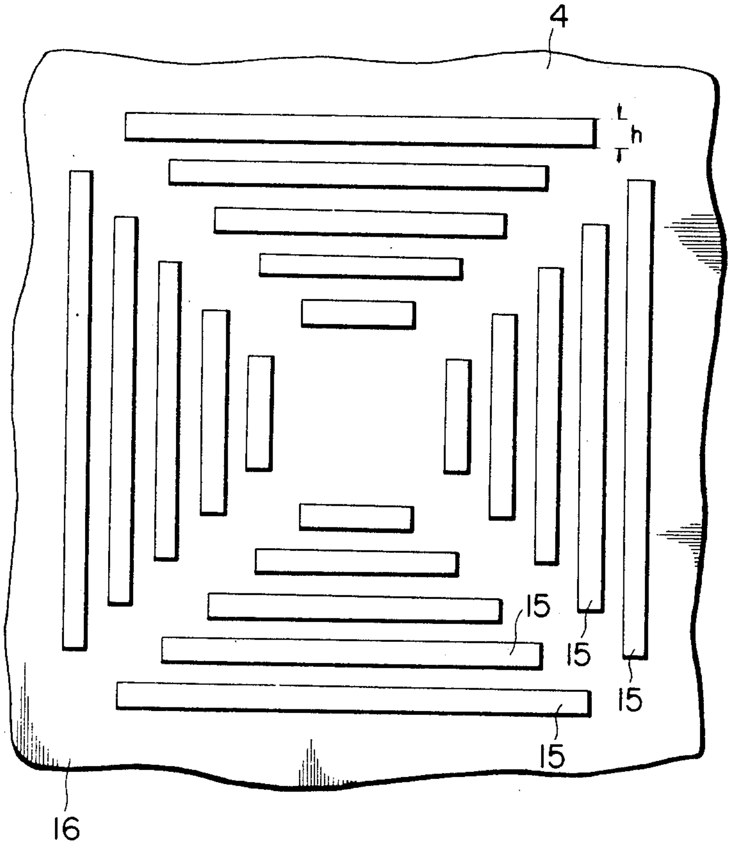
FIG. 4 is a plan view of a position detecting pattern formed on a mask.

A description will next be made of the position detecting patterns of the semiconductor wafer 3 and the mask 4, and the switching slit 12 referring to FIGS. 2 to 6. The position detecting pattern of the semiconductor wafer 3 provided by etching at a peripheral portion thereof comprises an etched portion 13 consisting of five rows of irregular surface areas arranged outwardly from the center of the pattern at predetermined intervals and a non-etched portion 14 consisting of a smooth surface as shown in FIGS. 2 and 3. The position detecting pattern of the mask 4 consists of five rows of transparent windows 15 arranged outwardly from the center of the pattern at predetermined intervals and an opaque area 16 as shown in FIG. 4. A superimposition of the position detecting pattern of the mask 4 on that of the semiconductor wafer 3 is as shown in FIG. 5.

Figure 5:
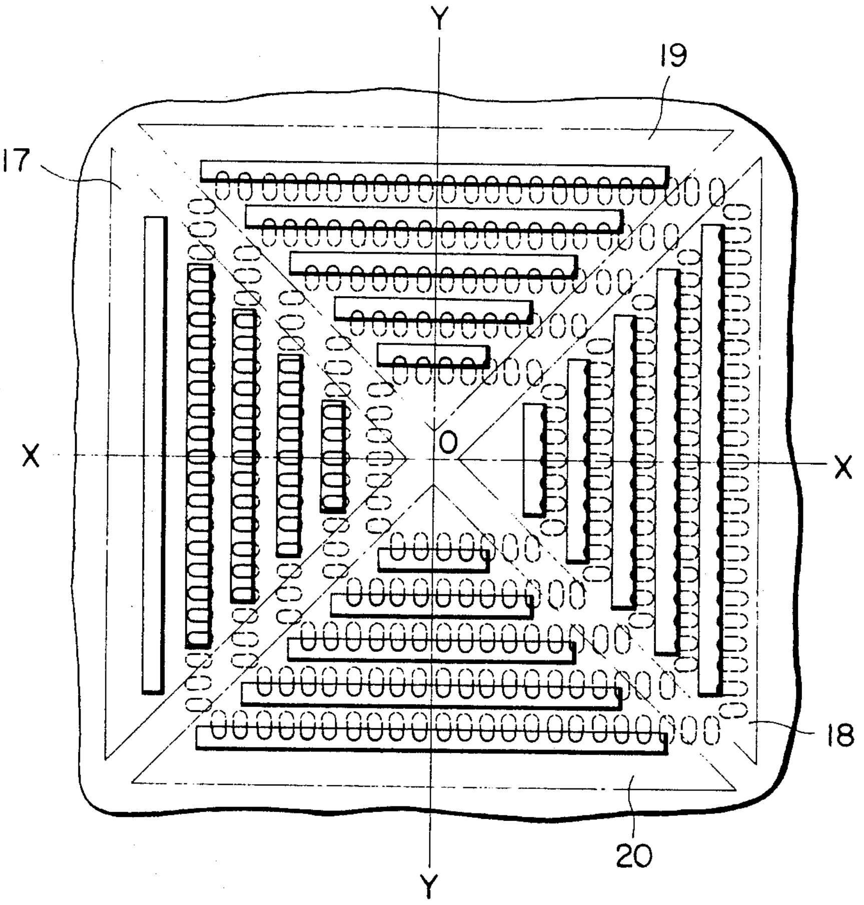
FIG. 5 is a plan view of the position detecting pattern of the mask overlying the counterpart position detecting pattern of the semiconductor wafer.

When the superimposed position detecting patterns shown in FIG. 5 are illuminated with light, the light reflected by the etched portion 13 of the pattern of the semiconductor wafer 3 rarely reaches the photoelectric elements 11 because the reflection is an irregular reflection, while the light reflected by the non-etched portion 14 reaches the photoelectric elements 11 because the reflection is a regular reflection. Consequently, the relative position between the position detecting patterns of the semiconductor wafer 3 and the mask 4 can be determined by detecting the amount of light reflected through the windows 15 of the position detecting pattern of the mask 4. For example, if the position detecting pattern is divided into four regions 17, 18, 19 and 20 by two orthogonal straight lines passing through the center or origin 0 and at an angle 45° to the X-axis as shown in FIG. 5, and if the light reflected by the entire area of the region 17 is received by the photoelectric element 11*a* and the light reflected by the entire area of the region 18 is received by the photoelectric element 11*b* to produce respective electric signals corresponding to the respective received amounts of reflected light which are differentially amplified by the control circuit C, the fine alignment of the patterns can be effected by controlling the motor B for fine alignment so that the output signal of the photoelectric element 11*a* becomes equal to the output signal of the photoelectric element 11*b*. The fine alignment in the Y-direction can be similarly effected. The alignment in the rotational direction can be effected by providing an additional position detecting pattern to each of the semiconductor wafer 3 and the mask 4 at an opposite peripheral portion and an additional microscope for position detection correspondingly to the additional pattern and by comparing the output signals of the photoelectric elements of the two microscopes.

Thus, since the position detecting pattern of the mask 4 having the function of fine alignment is composed of a plurality of pattern elements, the windows 15, arranged outwardly from the center, the size h of the window 15 in the direction of the coordinate axis can be reduced without increasing the size of the position detecting pattern and without reducing the amount of reflected light from the position detecting pattern, thereby improving the pattern gain $\Delta Q/Q$, and hence the accuracy of relative position detection. Furthermore, since the position detecting pattern of the mask 4 consists of an arrangement of a plurality of pattern elements of the same configuration, the influence of the configuration defect of each pattern element and the unevenness of etching of the position detecting pattern of the semiconductor wafer 3 on the accuracy of relative position detection can be reduced.

Figure 6:
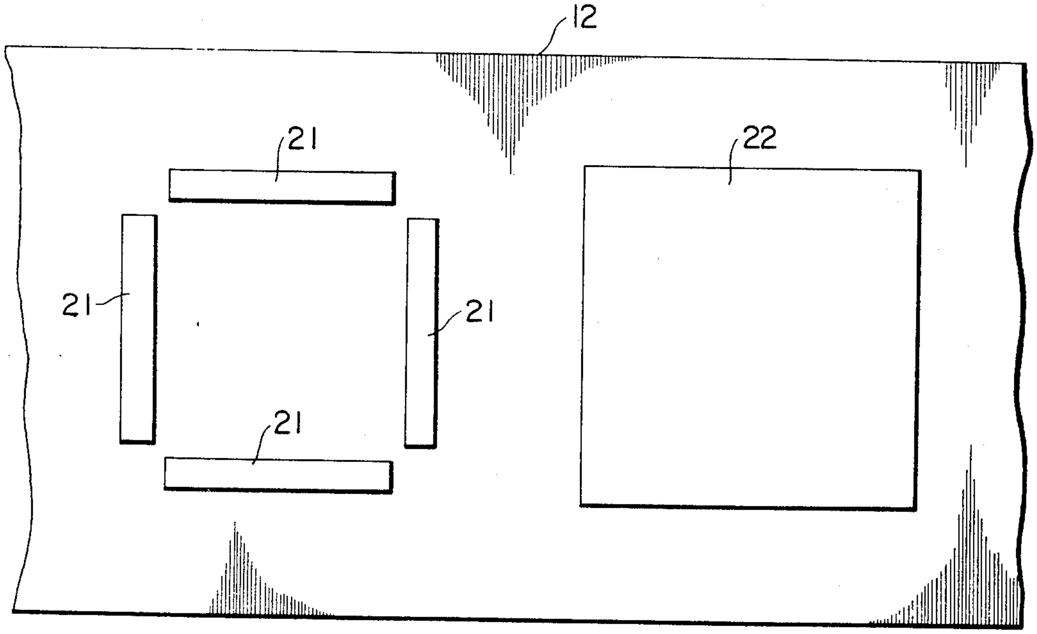
FIG. 6 is a plan view of a switching slit.

On the other hand, if the position detecting pattern of the semiconductor wafer 3 is in a position shifted in the X-direction relative to the position detecting pattern of the mask 4 when the position detecting pattern of the mask 4 is superimposed on the position detecting pattern of the semiconductor wafer 3 as shown in FIG. 5, the amount of the reflected light from the region 17 is not necessarily abundant because the position detecting pattern of the mask 4 consists of a plurality of pattern elements, windows. Consequently, a switching slit 12 as shown in FIG. 6 is positioned in front of the photoelectric elements 11. At first, the switching slit 12 is switched to the side of the four windows 21 so that the photoelectric elements 11 receive the reflected light only from the outermost windows 15 of the position detecting pattern to effect coarse alignment in the X-direction. Next, the switching slit 12 is switched to the side of the square window 22 so that the reflected light from the entire position detecting pattern is received by the photoelectric elements 11 to effect fine alignment in the X-direction. Coarse alignment and fine alignment in the Y-direction and the rotational direction can be similarly performed. The switching of the switching slit 12 is performed automatically by the motor for driving the switching slit 12 by the instruction from the control circuit C.

In this manner, both coarse alignment and fine alignment can be effected by providing counterpart position detecting patterns consisting of a plurality of pattern elements arranged outwardly from the center to the semiconductor wafer 3 and the mask 4 and by switching the detection of the reflected light from the position detecting pattern by means of the switching slit 12.

What we claim is:

1. A method for aligning a mask for the manufacture of semiconductor integrated circuits with a semiconductor wafer, by overlying a reflective position detecting pattern formed on a surface of the semiconductor wafer on a light-permeable position detecting pattern formed on said mask and by detecting the amount of light which is reflected at said reflective position detecting pattern and transmitted through said light-permeable position detecting pattern, by projecting light on said reflective position detecting pattern through said lightpermeable position detecting pattern, said method comprising the steps of:

a. providing said light-permeable position detecting pattern to include a pair of first and second sections each provided with a plurality of spaced window areas which are disposed in parallel with a predetermined direction and adapted to transmit light therethrough;

b. providing said reflective position detecting pattern to include a plurality of spaced areas which extend in parallel to said predetermined direction and have a light reflection characteristic different from the remaining area;

c. detecting, by a first detecting means, the amount of light reflected and transmitted through the window areas provided in said first section of said light-permeable position detecting pattern after being reflected at the corresponding areas of said reflective position detecting pattern;

d. detecting, by a second detecting means, the amount of light reflected and transmitted through the window areas provided in said second section of said light-permeable position detecting pattern; and e. effecting a fine adjustment of the relative position between said mask and said semiconductor wafer for aligning said mask with said semiconductor in accordance with the detection of the amount of light detected by said first and second detecting means.

2. A method according to claim 1, further comprising, prior to said detecting step (c), the steps of:

c1. detecting, by the first detecting means, the amount of limited light reflected and transmitted through only one of the window areas provided in said first section, said one window area being the most remote window from said second section;

c2. detecting, by the second detecting means, the amount of limited light reflected and transmitted through only one of the window areas provided in said second section, said one window area being the most remote window from said first section; and c3. effecting a coarse adjustment of the relative position between said mask and said semiconductor wafer for aligning said mask and said semiconductor wafer in accordance with the detection of the amount of limited light by said first and second means.

3. An apparatus for aligning a mask for the manufacture of semiconductor integrated circuits with a semiconductor wafer, said wafer having a reflective position detecting pattern formed on a surface thereof, said pattern including a plurality of spaced apart areas which extend in parallel to a predetermined direction and have a light reflection characteristic different from the remainder of the pattern, comprising:

a mask having a light-permeable position detecting pattern formed thereon, and including a pair of first and second sections each provided with a plurality of spaced apart window areas which are disposed in parallel with said predetermined direction and are adapted to transmit light therethrough;

first means for projecting light onto said wafer, so that light will be reflected from said reflective position detecting pattern thereon toward said mask;

second means detecting the amount of light reflected from said reflective position detecting pattern on said wafer and transmitted through the window areas provided in the first section of said light-permeable position detecting pattern on said mask;

third means for detecting the amount of light reflected from said reflective position detecting pattern on said wafer and transmitted through the window areas provided in the second section of said light-permeable position detecting pattern on said mask; and fourth means, responsive to said second and third means, for displacing said semiconductor wafer relative to said mask in accordance with the amount of light detected by said first and second means.

4. An apparatus according to claim 3, further comprising:

fifth means for selectively permitting only the limited light reflected and transmitted through one of the window areas provided in said first section and most remote from said second section to be detected by said second means, while permitting only the limited light reflected and transmitted through one of the window areas provided in said second section and most remote from said first section to be detected by said third means.

5. An apparatus according to claim 4, further comprising:

a wafer chuck for supporting said semiconductor wafer;

a carriage mechanically connected to said wafer chuck through elastic connecting means and movable by a screw mechanism;

first driving means, responsive to the detection of the amount of limited light by said second and third means, for driving the screw mechanism to move said carriage until the output of said second means becomes equal to the output of said third means, to thereby effect a coarse alignment of said wafer relative to said mask; and second driving means, mounted on said carriage and responsive to the detection of the amount of light by said second and third means, for moving said wafer chuck relative to said carriage with elastic deformation of said elastic means until the output of said second means becomes equal to the output of said third means, to thereby effect a fine alignment of said wafer relative to said mask.

6. An apparatus according to claim 3, wherein said reflective position detecting pattern further includes an additional plurality of spaced apart areas which extend in parallel to a prescribed direction different from said predetermined direction and have said light reflection characteristics;

said light-permeable position detecting pattern further includes a pair of third and fourth sections each provided with a plurality of spaced apart window areas which are disposed in parallel with said prescribed direction and are adapted to transmit light therethrough; and further including fifth means for detecting the amount of light reflected from said reflective position detecting pattern on said wafer and transmitted through the window areas in said third section of said light-permeable position detecting pattern;

sixth means for detecting the amount of light reflected from said reflective position detecting pattern on said wafer and transmitted through the window areas provided in the fourth section of said light-permeable detecting pattern;

and wherein said fourth means is further responsive to said fith and sixth means for displacing said wafer relative to said mask in accordance with the amount of light detected by said fifth and sixth means.

7. An apparatus according to claim 6, wherein said predetermined direction is orthogonal to said prescribed direction.

8. An apparatus according to claim 6, further comprising:

seventh means for selectively permitting only the limited light reflected and transmitted through one of the window areas provided in said first section and most remote from said second section to be detected by said second means, while permitting only the limited light reflected and transmitted through one of the window areas provided in said second section and most remote from said first section to be detected by said third means; and eighth means for selectively permitting only the limited light reflected and transmitted through one of the window areas provided in said third section and most remote from said fourth section to be detected by said fifth means, while permitting only the limited light reflected and transmitted through one of the window areas provided in said fourth section and most remote from said first section to be detected by said sixth means.

9. An apparatus according to claim 6, wherein the size of each window area of each section differs from those of the other window areas of that section.

10. An apparatus according to claim 9, wherein each window subtends a multiplicity of said areas the number of which corresponds to the size of that respective window when said wafer and said mask are aligned.

11. A method for aligning a first article relative to a second article comprising the steps of:

a. forming, on a first surface of said first article, a reflective position detecting pattern including a first plurality of spaced apart groups of areas aligned in parallel with a first predetermined direction and having a light reflection characteristic different from the remainder of the pattern;

b. forming, in said second article, a light-permeable position detecting pattern including a pair of first and second sections each provided with a plurality of spaced apart window areas which are disposed in parallel with said first predetermined direction and are adapted to transmit light therethrough;

c. positioning said second article with respect to said first article, so that light reflected from at least a portion of said reflective position detecting pattern on said first article will pass through at least a portion of the light-permeable position detecting pattern in said second article;

d. detecting the amount of light reflected from said reflective position detecting pattern on said first article and transmitted through the window areas provided in the first section of said light-permeable detecting pattern in said second article;

e. detecting the amount of light reflected from said reflective position detecting pattern on said first article and transmitted through the window areas provided in the second section of said light-permeable detecting pattern in said second article; and f. displacing said second article relative to said first article in accordance with the amount of light detected by steps (d) and (e).

12. A method according to claim 11, wherein said step (d) includes the step of d1. detecting the amount of light reflected from said position detecting pattern on said first article and transmitted only through that window of said first section of said light-permeable detecting pattern which is the most remote from the second section thereof;

said step (e) includes the step of e1. detecting the amount of light reflected from said position detecting pattern on said first article and transmitted only through that window of said second section of said light-permeable detecting pattern which is the most remote from the first section thereof; and said step (f) includes the step of f1. effecting a coarse adjustment of the relative position between said first and second articles in accordance with the amount of light detected in steps (d1) and (e1).

13. A method according to claim 11, wherein the size of each window area of each section differs from those of the other window areas of that section.

14. A method according to claim 13, wherein the number of areas in each group of areas corresponds to the size of the window subtending that respective group of areas when said first article is aligned with said second article.

15. A method according to claim 11, wherein said reflective position detecting pattern formed in step (a) further includes a second plurality of spaced apart groups of areas aligned in parallel with a second predetermined direction different from said first predetermined direction and having said light reflection characteristic, and said light-permeable position detecting pattern formed in step (b) further includes a pair of third and fourth sections each provided with a plurality of spaced apart window areas which are disposed in parallel with said section predetermined direction and are adapted to transmit light therethrough; and further including the steps of g. detecting the amount of light reflected from said reflective position detecting pattern on said first article and transmitted through the window areas provided in the third section of said light-permeable detecting pattern in said second article;

h. detecting the amount of light reflected from said reflective position detecting pattern on said first article and transmitted through the window areas provided in the fourth section of said light-permeable detecting pattern in said second article; and i. further displacing said second article relative to first article in accordance with the amount of light detected by steps (g) and (h).

16. A method according to claim 15, wherein said first predetermined direction is orthogonal to said second predetermined direction.

17. A method according to claim 15, wherein said step (d) includes the step of d1. detecting the amount of light reflected from said position detecting pattern on said first article and transmitted only through that window of said first section of said light-permeable detecting pattern which is the most remote from the second section thereof;

said step (e) includes the step of e1. detecting the amount of light reflected from said position detecting pattern on said first article and transmitted only through that window of said second section of said light-permeable detecting pattern which is the most remote from the first section thereof; and said step (f) includes the step of f1. effecting a coarse adjustment of the relative position between said first and second articles in accordance with the amount of light detected in steps (d1) and (e1);

said step (g) includes the step of g1. detecting the amount of light reflected from said position detecting pattern on said first article and transmitted only through that window of said third section of said light-permeable detecting pattern which is the most remote from the fourth section thereof;

said step (h) includes the step of h1. detecting the amount of light reflected from said position detecting pattern on said first article and transmitted only through that window of said fourth section of said light-permeable detecting pattern which is the most remote from said third section thereof; and said (i) includes the step of i1. effecting a further coarse adjustment of the relative position between said first and second articles in accordance with the amount of light detected in steps (g1) and (h1).

* * * * *